(12) United States Patent
Wu et al.

(10) Patent No.: US 9,076,667 B2
(45) Date of Patent: Jul. 7, 2015

(54) WHITE LIGHT EMITTING DIODE MODULE

(71) Applicant: UNITY OPTO TECHNOLOGY CO., LTD., New Taipei (TW)

(72) Inventors: Ching-Huei Wu, New Taipei (TW); Ping-Chen Wu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 0 days.

(21) Appl. No.: 13/785,391

(22) Filed: Mar. 5, 2013

(65) Prior Publication Data

US 2014/0145225 A1    May 29, 2014

(30) Foreign Application Priority Data

Nov. 23, 2012   (TW) .............................. 101143915 A (51) Int. Cl.
| | | |
|---|---|---|
| H01L 33/08 | (2010.01) | |
| H01L 25/075 | (2006.01) | |
| H01L 33/50 | (2010.01) | |

(52) U.S. Cl.
CPC ............. *H01L 25/0756* (2013.01); *H01L 33/50* (2013.01); *H01L 2224/48091* (2013.01); *H01L 2224/8592* (2013.01); *H01L 2224/45144* (2013.01)

(58) Field of Classification Search
USPC ....................................... 257/95–99
See application file for complete search history.

(56) References Cited

U.S. PATENT DOCUMENTS

| | | | |
|---|---|---|---|
| 2007/0170444 A1* | 7/2007 | Cao .................................. | 257/89 |
| 2007/0221925 A1* | 9/2007 | Aliyev et al. .................... | 257/79 |
| 2008/0191608 A1* | 8/2008 | Schmidt ......................... | 313/503 |
| 2012/0306356 A1* | 12/2012 | Yoon et al. ..................... | 313/503 |

\* cited by examiner

*Primary Examiner* — David Vu
*Assistant Examiner* — Jonathan Han
(74) *Attorney, Agent, or Firm* — Rosenberg, Klein & Lee (57) ABSTRACT

Disclosed is a white light emitting diode module including a conducting wire frame, a first primary color chip, a second primary color chip and a phosphor layer. The conducting wire frame has an accommodating groove. The first primary color chip is installed at the bottom of the middle of the accommodating groove, and the first primary color chip transmits a first light emitting source with a wavelength $\lambda_1$. The second primary color chip is stacked on top of the first primary color chip and the second primary color chip transmits a second light emitting source with a wavelength $\lambda_2$. The phosphor layer is formed on the second primary color chip and excited to produce a fluorescent light with a wavelength $\lambda_3$. Therefore, the stacked LED chips and the phosphor can be used to obtain a white light source with high color saturation.

5 Claims, 5 Drawing Sheets

WHITE LIGHT EMITTING DIODE MODULE

CROSS-REFERENCE TO RELATED APPLICATIONS

This non-provisional application claims priority under 35 U.S.C. §119(a) on Patent Application No(s). 101143915 filed in Taiwan, R.O.C. on Nov. 23, 2013, the entire contents of which are hereby incorporated by reference.

BACKGROUND OF THE INVENTION

1. Field of the Invention

The present invention relates to the field of illumination, and more particularly to a white light emitting diode module capable of using a stacked double chip to mix red phosphor to achieve high color saturation.

2. Description of the Related Art

Since light emitting diode (LED) has the advantages of low working voltage, small power consumption, high stability, long life, strong impact and vibration resistance, light weight, small volume and low cost, therefore the LED has been used extensively in many areas. In daily life, most of us use white light lamps for indoor illumination, so that the study of white light emitting diode has become an important subject.

At present, there are two main methods of producing a white LED as described below. 1. A combination of red, green and blue LEDs is used to produce a mixed light to obtain a white light source. 2. An LED light source is used to excite an illuminescent material to produce white light. For example, a blue LED together with phosphor that produces yellow light, or a blue LED together with two kinds of phosphors that produce green light and red light respectively, or a purple or ultraviolet LED that excites red, green and blue phosphors is used for producing white light.

Wherein, three chips (RGB) are packaged into an LED set. Although the white light produced by mixed lights has a relatively large color gamut and a good mixing light efficiency, the driving current of each chip can be adjusted freely to produce different colors. However, it is not easy to control the proportion of red, green and blue mixing lights, and the extent of the light emitting efficiency of each color being affected by temperature varies, and the life cycle of different chips varies, and the manufacturing cost is high, so that the aforementioned white light mixing method is not popular in the application of illumination.

Although the way of using a blue LED to excite yellow phosphor can produce white light, the chromaticity of the produced white light is poor and cannot be compared with the conventional incandescent lamp and cold cathode fluorescent lamp (CCFL). In addition, the way of using an ultraviolet LED to excite red, green and blue fluorescent lights to produce white light can produce a white light with high chromaticity. Since the light emitting efficiency of the ultraviolet LED is low and the ultraviolet power is high and the packaging material of LED may be aged easily, therefore this method cannot be applied in general illumination or a backlight modules.

Therefore, it is an urgent subject for the market to provide a design of a white light emitting diode module capable of simplifying the wire bonding process, lowering the cost, providing high color saturation, and improving the white light mixing effect.

SUMMARY OF THE INVENTION

In view of the problems of the prior art, it is a primary objective of the present invention to overcome the problems by providing a white light emitting diode module with high color saturation, so as to improve the white light mixing effect and achieve the effects of simplifying the wire bonding process and lowering the cost.

To achieve the aforementioned objective, the present invention provides a white light emitting diode module comprising a conducting wire frame, a first primary color chip, a second primary color chip and a phosphor layer. The conducting wire frame has an accommodating groove. The first primary color chip is installed at the bottom of the middle of the accommodating groove and has a light emitting surface area A1, and the first primary color chip transmits a first light emitting source with a wavelength $\lambda 1$, and 380 nm$\leq \lambda 1 \leq$470 nm. The second primary color chip is stacked on top of the first primary color chip and has a light emitting surface area A2, and the second primary color chip transmits a second light emitting source with a wavelength $\lambda 2$, and 500 nm$\leq \lambda 2 \leq$550 nm. The phosphor layer is formed on the second primary color chip and excited to produce a fluorescent light with a wavelength $\lambda 3$, and 600 nm$\leq \lambda 3 \leq$670 nm. Wherein, the light emitting surface areas of the first primary color chip and the second primary color chip satisfy the following relation:

$$0.5 \leq A1/A2 \leq 2.$$

To achieve the aforementioned objective, the present invention provides a white light emitting diode module, comprising a conducting wire frame, a first primary color chip, a second primary color chip and a phosphor layer. The conducting wire frame has an accommodating groove. The first primary color chip is installed at the bottom of the middle of the accommodating groove and has a light emitting surface area A1, and the first primary color chip transmits a first light emitting source with a wavelength $\lambda 1$, and 500 nm$\leq \lambda 2 \leq$550 nm. The second primary color chip is stacked on top of the first primary color chip and has a light emitting surface area A2, and the second primary color chip transmits a second light emitting source with a wavelength $\lambda 2$, and 380 nm$\leq \lambda 1 \leq$470 nm. The phosphor layer is formed on the second primary color chip and excited to produce a fluorescent light with a wavelength $\lambda 3$, and 600 nm$\leq \lambda 3 \leq$670 nm. Wherein, the light emitting surface areas of the first primary color chip and the second primary color chip satisfy the following relation:

$$0.5 \leq A1/A2 \leq 2.$$

Wherein, there are different implementation modes of the phosphor layer in the present invention, and the phosphor layer can be formed in the accommodating groove and covered onto the first primary color chip and the second primary color chip, or coated and encapsulated on the first primary color chip and the second primary color chip, or the phosphor layer is attached onto the second primary color chip having a light emitting surface area A3 and the primary color chips. Wherein, the light emitting surface area $A_2$ of the second primary color chip and the light emitting surface area $A_3$ of the phosphor plate satisfy the following relation:

$$0.8 \leq A3/A2 \leq 1.$$

In addition, the first primary color chip and the second primary color chip are coupled to positive and negative electrodes of the conducting wire frame by the plurality of conducting wires respectively, or the first primary color chip has a plurality of bumps attached in the accommodating groove of the conducting wire frame, and the second primary color chip is coupled to the positive and negative electrodes of the conducting wire frame by the plurality of conducting wires.

DETAILED DESCRIPTION OF THE PREFERRED EMBODIMENTS

The technical content of the present invention will become apparent with the detailed description of preferred embodiments and the illustration of related drawings as follows.

Figure 1:
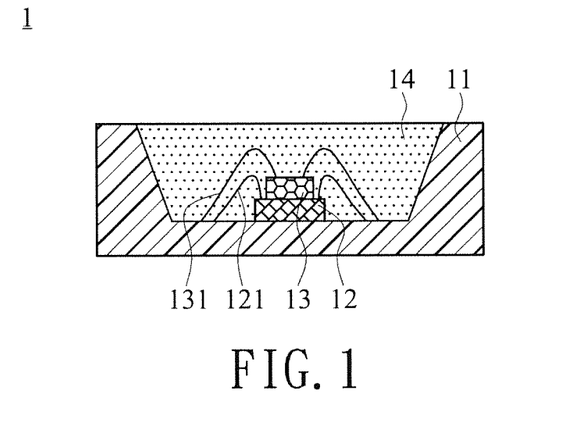
FIG. 1 is a schematic view of a white light emitting diode module of a first preferred embodiment of the present invention.

With reference to FIG. 1 for a schematic view of a white light emitting diode module of the first preferred embodiment of the present invention, the white light emitting diode module 1 comprises a conducting wire frame 11, a first primary color chip 12, a second primary color chip 13 and a phosphor layer 14. The conducting wire frame 11 has an accommodating groove. Wherein, the conducting wire frame 11 is electroplated to enhance the resistance of surface corrosion and the solderability after the stamping process of metal, and finally formed by plastic injection molding, wherein the metal includes but not limited to a copper alloy.

The first primary color chip 12 and the second primary color chip 13 are a blue LED chip and a green LED chip respectively, wherein the first primary color chip 12 is installed at the bottom of the accommodating groove of the conducting wire frame 11, and the first primary color chip 12 has a light emitting surface area $A_1$, and the first primary color chip 12 transmits a first light emitting source with a wavelength $\lambda_1$, and 380 nm≤$\lambda_1$≤470 nm. The second primary color chip 13 is stacked on top of the first primary color chip 12 and has a light emitting surface area $A_2$, and the second primary color chip 13 transmits a second light emitting source with a wavelength $\lambda_2$, and 500 nm≤$\lambda_2$≤550 nm.

The ratio of the light emitting surface area $A_1$ of the first primary color chip 12 to the light emitting surface area $A_2$ of the second primary color chip 13 of the white light emitting diode module 1 is 0.5≤$A_1/A_2$≤2. In this preferred embodiment of the present invention, the ratio of the light emitting surface area $A_1$ of the first primary color chip 12 to the light emitting surface area $A_2$ of the second primary color chip 13 preferably 0.5≤$A_1/A_2$<1.

Wherein, the first primary color chip 12 and the second primary color chip 13 are coupled to positive and negative electrodes of the conducting wire frame 11 by a plurality of conducting wires 121, 131 respectively. Preferably, the conducting wires 121, 131 are gold wires.

The phosphor layer 14 is filled and disposed in an accommodating groove of the conducting wire frame 11 and covered onto the first primary color chip 12 and the second primary color chip 13, and excited to produce a fluorescent light with a wavelength $\lambda_3$, and 600 nm≤$\lambda_3$≤670 nm.

Preferably, the wavelength $\lambda_1$ of the first light emitting source is 450 nm≤$\lambda_1$≤452 nm, the wavelength $\lambda_1$ of the second light emitting source is 522 nm≤$\lambda_2$≤525 nm, and the wavelength $\lambda_3$ of the fluorescent light is 650 nm.

Therefore, the white light emitting diode module 1 of the present invention mixes the first light emitting source, the second light emitting source and the fluorescent light according to the wavelengths and the ratio of light emitting surface areas to produce a white light source with higher color saturation.

Therefore, the white light emitting diode module 1 of the present invention can have a color saturation up to 98% and a light emitting efficiency falling within a range of 55~60 lm/W to obtain a better white light source, and thus can be applied to various types of backlight modules or illumination equipments.

Figure 2:
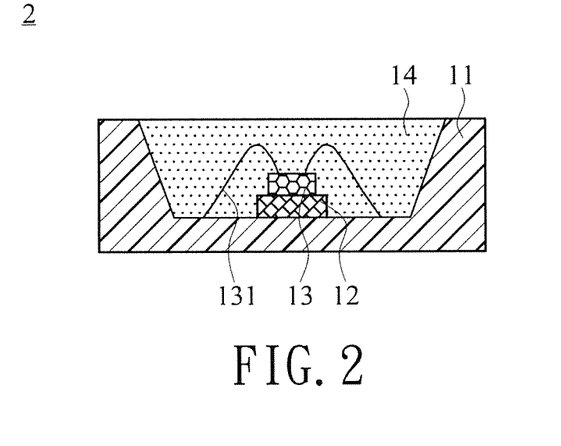
FIG. 2 is a schematic view of a white light emitting diode module of a second preferred embodiment of the present invention.

With reference to FIG. 2 for a schematic view of a white light emitting diode module of the second preferred embodiment of the present invention, the white light emitting diode module 2 comprises a conducting wire frame 11, a first primary color chip 12, a second primary color chip 13 and a phosphor layer 14. The conducting wire frame 11 has an accommodating groove. The first primary color chip 12 and the second primary color chip 13 can be blue LED chip and green LED chip respectively, wherein the first primary color chip 12 is installed in the accommodating groove of the conducting wire frame 11, and the second primary color chip 13 is stacked on top of the first primary color chip 12. It is noteworthy to be noted that the first primary color chip 12 has a plurality of bumps, and the bumps are attached in the accommodating groove of the conducting wire frame 11, such that positive and negative electrodes of the conducting wire frame 11 can be coupled to the bumps to conduct the first primary color chip 12 and the conducting wire frame 11. The second primary color chip 13 is coupled to the positive and negative electrodes of the conducting wire frame 11 by a plurality of conducting wires 131, and the conducting wires 131 can be gold wires, but the invention is not limited to gold wires only. Therefore, the number of conducting wires 131 used can be reduced to lower the cost and simplify the manufacturing procedure. The phosphor layer 14 is disposed in the accommodating groove of the conducting wire frame 11 and covered onto the first primary color chip 12 and the second primary color chip 13.

The first primary color chip 12 has a light emitting surface area $A_1$, and the second primary color chip 13 has a light emitting surface area $A_2$, and the ratio of the light emitting surface area $A_1$ to the light emitting surface area $A_2$ of the present invention is 0.5≤$A_1/A_2$≤2. It is noteworthy to be noted that the ratio of the light emitting surface area $A_1$ of the first primary color chip 12 to the light emitting surface area $A_2$ of the second primary color chip 13 of this preferred embodiment is preferably $0.5 \leq A_1/A_2 < 1$.

Figure 3:
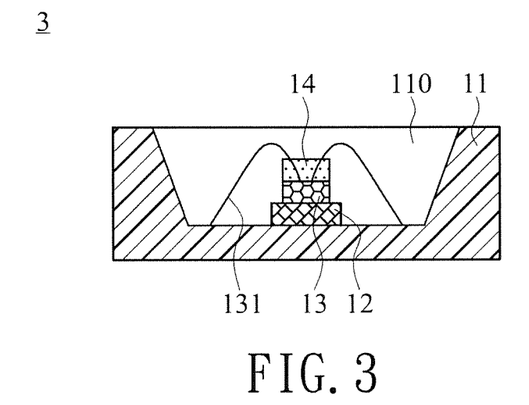
FIG. 3 is a schematic view of a white light emitting diode module of a third preferred embodiment of the present invention.

With reference to FIG. 3 for a schematic view of a white light emitting diode module of the third preferred embodiment of the present invention, the white light emitting diode module 3 comprises a conducting wire frame 11, a first primary color chip 12, a second primary color chip 13 and a phosphor layer 14. The conducting wire frame 11 has an accommodating groove 110. The first primary color chip 12 has a plurality of bumps attached onto the bottom of the accommodating groove 110 of the conducting wire frame 11. Although the bumps are not shown in the figure, the bumps exist and attach the bottom of the accommodating groove 110.

The first primary color chip 12 has a light emitting surface area $A_1$, and the first primary color chip 12 transmits a first light emitting source with a wavelength $\lambda_1$, and 380 nm$\leq \lambda_1 \leq$470 nm. The second primary color chip 13 is coupled to positive and negative electrodes of the conducting wire frame 11 by a plurality of conducting wires 131 and stacked on top of the first primary color chip 12, and has a light emitting surface area $A_2$, and the second primary color chip 13 transmits a second light emitting source with a wavelength $\lambda_2$, and 500 nm$\leq \lambda_2 \leq$550 nm.

The phosphor layer 14 is a phosphor plate, and the phosphor plate is attached onto the second primary color chip 13 and has a light emitting surface area $A_3$, and the phosphor plate is excited to produce a red fluorescent light with a wavelength $\lambda_3$, and 600 nm$\leq \lambda_3 \leq$670 nm.

Preferably, the first light emitting source has the wavelength $\lambda_1$ and 450 nm$\leq \lambda_1 \leq$452 nm, and the second light emitting source has the wavelength $\lambda_2$ and 522 nm$\leq \lambda_2 \leq$525 nm, and the fluorescent light has the wavelength $\lambda_3$ of 650 nm in this preferred embodiment.

Since the first primary color chip 12, the second primary color chip 13 and the phosphor layer 14 have light emitting surface areas that affect the light mixing effect, therefore the light emitting surface areas of the first primary color chip 12, the second primary color chip 13 and the phosphor layer 14 of the present invention satisfy the following relation:

$$0.5 \leq A_1/A_2 \leq 2; \text{ and}$$

$$0.8 \leq A_3/A_2 \leq 1.$$

In this preferred embodiment, the ratio of the light emitting surface area $A_1$ of the first primary color chip 12 to the light emitting surface area $A_2$ of the second primary color chip 13 is $0.5 \leq A_1/A_2 \leq 1$, and the ratio of the light emitting surface area $A_2$ of the second primary color chip 13 to the light emitting surface area $A_3$ of the phosphor layer 14 is preferably 1, but the invention is not limited to such arrangement only.

In this preferred embodiment, the phosphor layer 14 is adhered onto the second primary color chip 13, so as to reduce the material consumption and the cost of the phosphor layer 14.

Figure 4:
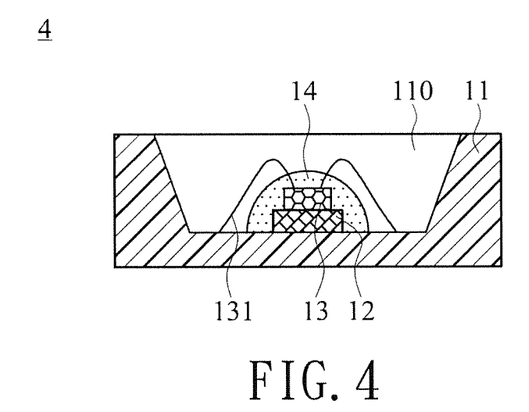
FIG. 4 is a schematic view of a white light emitting diode module of a fourth preferred embodiment of the present invention.

With reference to FIG. 4 for a schematic view of a white light emitting diode module of the fourth preferred embodiment of the present invention, the white light emitting diode module 4 comprises a conducting wire frame 11, a first primary color chip 12, a second primary color chip 13 and a phosphor layer 14. The conducting wire frame 11 has an accommodating groove 110. The first primary color chip 12 has a plurality of bumps attached in the accommodating groove 110 of the conducting wire frame 11 and has a light emitting surface area $A_1$. The second primary color chip 13 is coupled to positive and negative electrodes of the conducting wire frame 11 by a plurality of conducting wires 131 and stacked on top of the first primary color chip 12, and the second primary color chip 13 has a light emitting surface area $A_2$.

In the present invention, the light emitting surface area $A_1$ of the first primary color chip 12 and the light emitting surface area $A_2$ of the second primary color chip 13 satisfy the following relation:

$$0.5 \leq A_1/A_2 \leq 2.$$

In this preferred embodiment, the ratio of the light emitting surface area $A_1$ of the first primary color chip 12 to the light emitting surface area $A_2$ of the second primary color chip 13 is preferably $0.5 \leq A_1/A_2 < 1$.

The phosphor layer 14 is formed on the first primary color chip 12 and the second primary color chip 13 by physical vapor deposition and covered onto the first primary color chip 12 and the second primary color chip 13.

It is noteworthy to be noted that the first primary color chip 12 has a plurality of bumps attached in the accommodating groove 110 of the conducting wire frame 11, and the second primary color chip 13 is coupled to positive and negative electrodes of the conducting wire frame 11 by a plurality of conducting wires 131. Preferably, the conducting wires 131 are gold wires.

Therefore, the number of gold wires used in the white light emitting diode module 4 of the present invention can be reduced to lower the cost and simplify the manufacturing procedure.

Figure 5:
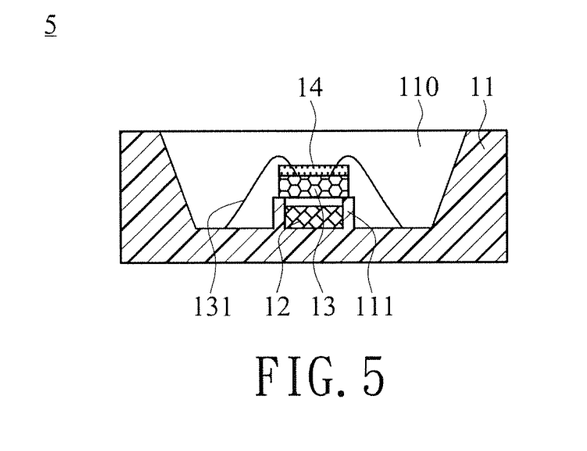
FIG. 5 is a schematic view of a white light emitting diode module of a fifth preferred embodiment of the present invention.

With reference to FIG. 5 for a schematic view of a white light emitting diode module of the fifth preferred embodiment of the present invention, the white light emitting diode module 5 comprises a conducting wire frame 11, a first primary color chip 12, a second primary color chip 13 and a phosphor layer 14. The conducting wire frame 11 has an accommodating groove 110, and the conducting wire frame 11 includes a bridge 111. The first primary color chip 12 and the second primary color chip 13 are blue LED chip and green LED chip, wherein the first primary color chip 12 is installed within the bridge 111 and fixed to the bottom of the accommodating groove 110 of the conducting wire frame 11. The first primary color chip 12 has a light emitting surface area $A_1$, and the first primary color chip 12 transmits a first light emitting source with a wavelength $\lambda_1$, and 380 nm$\leq \lambda_1 \leq$470 nm.

The second primary color chip 13 is installed at the top of the first primary color chip 12, and both sides of the second primary color chip 13 are set on the bridge 111, so that when the second primary color chip 13 emits light, the bridge 111 can be used for dissipating heat, so as to improve the heat dissipation speed and effect. The second primary color chip 13 has a light emitting surface area $A_2$, and the second primary color chip 13 emits a second light emitting source with a wavelength $\lambda_2$, and 500 nm$\leq \lambda_2 \leq$550 nm. Wherein, the light emitting surface area $A_1$ of the first primary color chip 12 is smaller than the light emitting surface area $A_2$ of the second primary color chip 13. In the present invention, the light emitting surface area $A_1$ the first primary color chip 12 and the light emitting surface area $A_2$ of the second primary color chip 13 satisfy the following relation:

$$0.5 \leq A_1/A_2 \leq 2.$$

In this preferred embodiment, the ratio of the light emitting surface area $A_1$ of the first primary color chip 12 to the light emitting surface area $A_2$ of the second primary color chip 13 is preferably $1 \leq A_1/A_2 \leq 2$.

Figure 6:
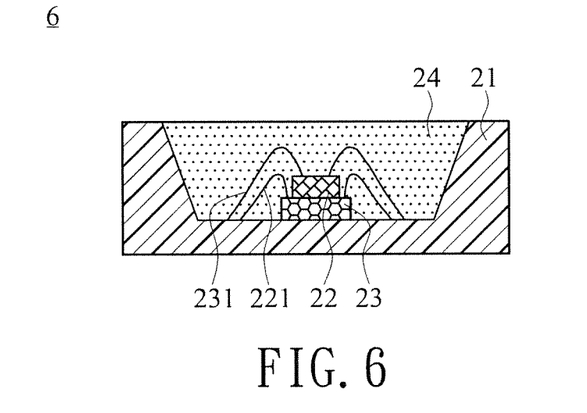
FIG. 6 is a schematic view of a white light emitting diode module of a sixth preferred embodiment of the present invention.

According to the first to fifth preferred embodiments, the present invention also provides the sixth to tenth preferred embodiments as examples for a further description of the invention With reference to FIG. 6 for a schematic view of a white light emitting diode module of the sixth preferred embodiment of the present invention, the white light emitting diode module 6 comprises a conducting wire frame 21, a first primary color chip 23, a second primary color chip 22 and a phosphor layer 24. The conducting wire frame 21 has an accommodating groove 210 formed by stamping a metal and electroplated to enhance the surface corrosion resistance and the solderability, and finally manufactured by plastic injection molding.

The first primary color chip 23 and the second primary color chip 22 are green LED chip and blue LED chip respectively, wherein the first primary color chip 23 is installed at of the bottom of the middle of the accommodating groove 210 of the conducting wire frame 2 and has a light emitting surface area $A_1$, and the first primary color chip 23 emits a first light emitting source with a wavelength $\lambda_1$, and 500 nm≤$\lambda_1$≤550 nm. The second primary color chip 22 is stacked on top of the first primary color chip 23 and has a light emitting surface area $A_2$, and the second primary color chip 22 transmits a second light emitting source with a wavelength $\lambda_2$, and 380 nm≤$\lambda_2$≤470 nm.

Wherein, the first primary color chip 23 and the second primary color chip 22 are coupled to positive and negative electrodes of the conducting wire frame 21 by a plurality of conducting wires 221, 231 respectively. Preferably, the conducting wires 221, 231 are gold wires.

The phosphor layer 24 is disposed in the accommodating groove 210 and covered onto the first primary color chip 23 and the second primary color chip 22, and excited to produce red fluorescent light with a wavelength $\lambda_3$, and 600 nm≤$\lambda_3$≤670 nm.

Preferably, the first light emitting source has the wavelength $\lambda_1$, wherein 522 nm≤$\lambda_1$≤525 nm, the second light emitting source has the wavelength $\lambda_2$, wherein 450 nm≤$\lambda_2$≤452 nm, the fluorescent light has the wavelength $\lambda_3$ equal to 650 nm. In the present invention, the light emitting surface areas of the first primary color chip 23 and the second primary color chip 22 satisfy the following relation:

$$0.5 \leq A_1/A_2 \leq 2.$$

In this preferred embodiment, the ratio of the light emitting surface area $A_1$ of the first primary color chip 23 to the light emitting surface area $A_2$ of the second primary color chip 22 is preferably 0.5≤$A_1/A_2$<1.

With reference to the following table for the measurement of chromaticity of the white light emitting diode module 6 of the present invention, the white light emitting diode module 6 together with a color filter are used to measure the RGB chromaticity coordinate values of the white light emitting diode module 6.

TABLE 1

| Light Source | CIE xy chromaticity coordinate | |
|---|---|---|
| | X-coordinate | Y-coordinate |
| Red | 0.6719 | 0.3131 |
| Green | 0.2181 | 0.6955 |
| Blue | 0.1536 | 0.0661 |

From the x-coordinate and y-coordinate, the magnitude and the shape of color gamut can be determined, so that the white light emitting diode module 6 of the present invention can produce a white light source with higher color saturation based on the wavelengths and the ratio of the light emitting surface areas.

In this preferred embodiment, the color saturation of the white light emitting diode module 6 is up to 98.06% when chromaticity coordinates defined by NTSC or the color saturation of the white light emitting diode module 6 is up to 97.61% when chromaticity coordinates defined by Adobe RGB respectively, and the light emitting efficiency of white light emitting diode module 6 falls within a range of 55-60 lm/W.

Figure 7:
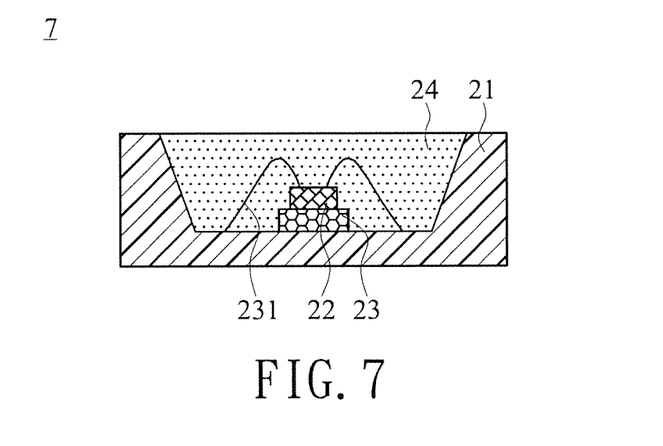
FIG. 7 is a schematic view of a white light emitting diode module of a seventh preferred embodiment of the present invention.

With reference to FIG. 7 for a schematic view of a white light emitting diode module of the seventh preferred embodiment of the present invention, the white light emitting diode module 7 comprises a conducting wire frame 21, a first primary color chip 23, a second primary color chip 22 and a phosphor layer 24. The conducting wire frame 21 has an accommodating groove. The first primary color chip 23 is installed at the bottom of the accommodating groove of the conducting wire frame 21, and the second primary color chip 22 is stacked on top of the first primary color chip 23, and the phosphor layer 24 is disposed in the accommodating groove of the conducting wire frame 21 and covered onto the first primary color chip 23 and the second primary color chip 22.

The difference between this preferred embodiment and the first preferred embodiment resides on that the first primary color chip 23 has a plurality of bumps attached onto the bottom of the conducting wire frame 21, and the second primary color chip 22 is coupled to positive and negative electrodes of the conducting wire frame 21 by a plurality of conducting wires 231. Therefore, the number of conducting wires 231 used can be reduced to lower the cost and simplify the manufacturing procedure.

Figure 8:
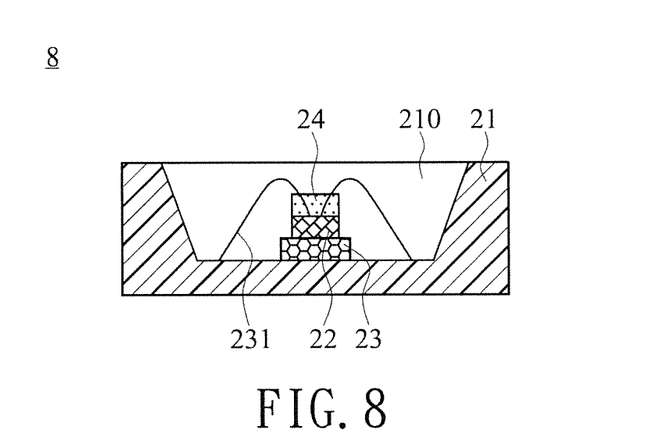
FIG. 8 is a schematic view of a white light emitting diode module of an eighth preferred embodiment of the present invention.

With reference to FIG. 8 for a schematic view of a white light emitting diode module of the eighth preferred embodiment of the present invention, the white light emitting diode module 8 comprises a conducting wire frame 21, a first primary color chip 23, a second primary color chip 22 and a phosphor layer 24. The conducting wire frame 21 has an accommodating groove 210. The first primary color chip 23 and the second primary color chip 22 are green LED chip and blue LED chip respectively, wherein the first primary color chip 23 has a plurality of bumps attached in the accommodating groove 210 of the conducting wire frame 21, and the first primary color chip 23 has a light emitting surface area $A_1$, and the first primary color chip 23 transmits a first light emitting source with a wavelength $\lambda_1$, and 500 nm≤$\lambda_1$≤550 nm. The second primary color chip 22 is coupled to positive and negative electrodes of the conducting wire frame 21 by a plurality of conducting wires 231 and stacked on top of the first primary color chip 23 and has a light emitting surface area $A_2$, and the second primary color chip 22 transmits a second light emitting source with a wavelength $\lambda_2$, and 380 nm≤$\lambda_2$≤470 nm.

The phosphor layer 24 is a phosphor plate attached onto the second primary color chip 22 and having a light emitting surface area $A_3$, and excited to produce red fluorescent light with a wavelength $\lambda_3$, and 600 nm≤$\lambda_3$≤670 nm.

Preferably, the first light emitting source has the wavelength $\lambda_1$ wherein 522 nm≤$\lambda_1$≤525 nm, the second light emitting source has the wavelength $\lambda_2$ wherein 450 nm≤$\lambda_2$≤452 nm, and the fluorescent light has the wavelength $\lambda_3$ equal to 650 nm in this preferred embodiment.

Since the first primary color chip 23, the second primary color chip 22 and the phosphor layer 24 have light emitting surface areas that affect the light mixing effect, therefore the light emitting surface areas of the first primary color chip 23, the second primary color chip 22 and the phosphor layer 24 of the present invention satisfy the following relation:

$$0.5 \leq A_1/A_2 \leq 2;$$

$$0.8 \leq A_3/A_2 \leq 1.$$

In this preferred embodiment, the ratio of the light emitting surface area $A_1$ of the first primary color chip 23 to the light emitting surface area $A_2$ of the second primary color chip 22 is preferably $0.5 \leq A_1/A_2 < 1$. In addition, the phosphor layer 24 is attached onto the second primary color chip 22, so that the material consumption of the phosphor layer 24 can be reduced to lower the cost and expense.

Figure 9:
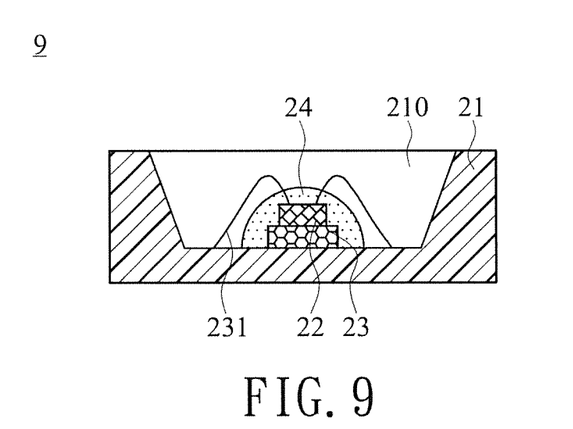
FIG. 9 is a schematic view of a white light emitting diode module of a ninth preferred embodiment of the present invention.

With reference to FIG. 9 for a schematic view of a white light emitting diode module of the ninth preferred embodiment of the present invention, the white light emitting diode module 9 comprises a conducting wire frame 21, a first primary color chip 23, a second primary color chip 22 and a phosphor layer 24. The conducting wire frame 21 has an accommodating groove 210. The first primary color chip 23 has a plurality of bumps attached onto the bottom of the accommodating groove 210 of the conducting wire frame 21 and a light emitting surface area $A_1$. The second primary color chip 22 is coupled to positive and negative electrodes of the conducting wire frame 21 by a plurality of conducting wires 231, and the second primary color chip 22 is stacked on top of the first primary color chip 23 and has a light emitting surface area $A_2$.

In the present invention, the light emitting surface area $A_1$ of the first primary color chip 23 and the light emitting surface area $A_2$ of the second primary color chip 22 satisfy the following relation:

$$0.5 \leq A_1/A_2 \leq 2.$$

In this preferred embodiment, the ratio of the light emitting surface area $A_1$ of the first primary color chip 23 to the light emitting surface area $A_2$ of the second primary color chip 22 is preferably $0.5 \leq A_1/A_2 < 1$.

The phosphor layer 24 is coated and encapsulated on the first primary color chip 23 and the second primary color chip 22 and covered onto the first primary color chip 23 and the second primary color chip 22.

It is noteworthy to be noted that the first primary color chip 23 has a plurality of bumps attached in the accommodating groove 210 of the conducting wire frame 21, and the second primary color chip 22 is coupled to positive and negative electrodes of the conducting wire frame 21 by a plurality of conducting wires 231. Preferably, the conducting wires 231 are gold wires.

Therefore, the number of gold wires used in the white light emitting diode module 9 of the present invention can be reduced to lower the cost and simplify the manufacturing procedure.

Figure 10:
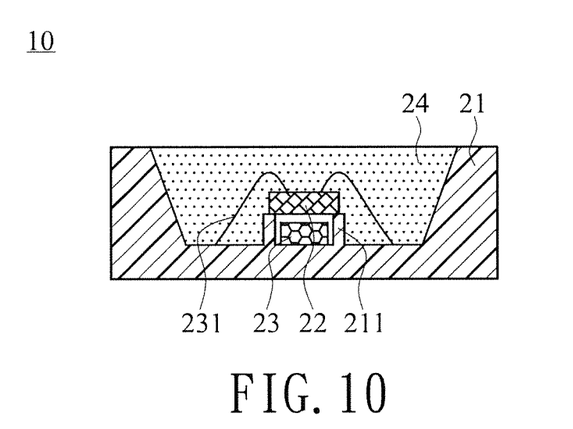
FIG. 10 is a schematic view of a white light emitting diode module of a tenth preferred embodiment of the present invention.

With reference to FIG. 10 for a schematic view of a white light emitting diode module of the tenth preferred embodiment of the present invention, the white light emitting diode module 10 comprises a conducting wire frame 21, a first primary color chip 23, a second primary color chip 22 and a phosphor layer 24. The conducting wire frame 21 has an accommodating groove, and the conducting wire frame 11 includes a bridge 211. The first primary color chip 23 and the second primary color chip 22 re green LED chip and blue LED chip respectively, wherein the first primary color chip 23 is installed within the bridge 211 and fixed to the bottom of the accommodating groove of the conducting wire frame 21. The first primary color chip 23 has a light emitting surface area $A_1$, and the first primary color chip 23 transmits a first light emitting source with a wavelength $\lambda_1$, and 500 nm $\leq \lambda_1 \leq$ 550 nm.

The second primary color chip 22 is installed at the top of the first primary color chip 23, and both sides of the second primary color chip 22 are set on the bridge 211, so that when the second primary color chip 22 emits light, the bridge 211 can be used for dissipating heat to improve the heat dissipation speed and effect of the second primary color chip 22.

The second primary color chip 22 has a light emitting surface area $A_2$, and the second primary color chip 22 transmits a second light emitting source with a wavelength $\lambda_2$, and 380 nm $\leq \lambda_2 \leq$ 470 nm. Wherein, the first primary color chip 23 has a light emitting surface area $A_1$ smaller than the light emitting surface area $A_2$ of the second primary color chip 22, and the light emitting surface area $A_1$ of the first primary color chip 23 and the light emitting surface area $A_2$ of the second primary color chip 22 satisfy the following relation:

$$0.5 \leq A_1/A_2 \leq 2.$$

In this preferred embodiment, the ratio of the light emitting surface area $A_1$ of the first primary color chip 23 to the light emitting surface area $A_2$ of the second primary color chip 22 is preferably $1 \leq A_1/A_2 \leq 2$.

It is noteworthy to be noted that if the first primary color chip is a blue LED chip, and the second primary color chip is a green LED chip, blue light cannot penetrate through the LED chip at the top easily, and it is necessary to increase the current that passes through the first primary color chip in order to enhance the brightness of the first primary color chip, in addition to the first to tenth preferred embodiments as described above.

What is claimed is:

1. A white light emitting diode module, comprising:
    a conducting wire frame, having an accommodating groove;
    a first primary color chip, installed at the bottom of the middle of the accommodating groove, and having a light emitting surface area $A_1$, and the first primary color chip transmitting a first light emitting source with a wavelength $\lambda_1$, and 500 nm $\leq \lambda_1 \leq$ 550 nm;
    a second primary color chip, stacked on top of the first primary color chip, and having a light emitting surface area $A_2$, and transmitting a second light emitting source with a wavelength $\lambda_2$, and 380 nm $\leq \lambda_2 \leq$ 470 nm, and the first light emitting source and the second light emitting source being mixed to form a stacked light source; and
    a phosphor layer, disposed on the second primary color chip, and emitting a fluorescent light with a wavelength $\lambda_3$, and 600 nm $\leq \lambda_3 \leq$ 670 nm;
    wherein, the light emitting surface area $A_1$ of the first primary color chip and the light emitting surface area $A_2$ the second primary color chip satisfy the relation of $1 < A_1/A_2 \leq 2$,
    wherein the phosphor layer is a phosphor plate attached onto the second primary color chip and having a light emitting surface area $A_3$, and the light emitting surface area $A_2$ of the second primary color chip and the light emitting surface area $A_3$ of the phosphor plate satisfy the relation of $0.8 \leq A_3/A_2 \leq 1$.

2. The white light emitting diode module of claim 1, wherein the phosphor layer is filled and disposed in the accommodating groove, and covered onto the first primary color chip and the second primary color chip.

3. The white light emitting diode module of claim 1, wherein the phosphor layer is formed on the first primary color chip and the second primary color chip by physical vapor deposition.

4. The white light emitting diode module of claim 1, wherein the first primary color chip and the second primary color chip are coupled to positive and negative electrodes of the conducting wire frame by a plurality of conducting wires respectively.

5. The white light emitting diode module of claim 1, wherein the first primary color chip has a plurality of bumps attached in the accommodating groove of the conducting wire frame, and the second primary color chip is coupled to positive and negative electrodes of the conducting wire frame by a plurality of conducting wires.

* * * * *